US012757436B2

(12) United States Patent
Ku et al.

(10) Patent No.: US 12,757,436 B2
(45) Date of Patent: Oct. 6, 2026

(54) HIGH VOLTAGE DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chien-Ming Ku, Hsinchu (TW); Wei-Jen Chang, Miaoli (TW); Wen-Hsing Hsieh, Hsinchu (TW); Ming-Yang Hsu, Hsinchu (TW); Chia-Chi Ho, Hsinchu (TW); Chung-Shih Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 504 days.

(21) Appl. No.: 18/205,678

(22) Filed: Jun. 5, 2023

(65) Prior Publication Data

US 2024/0405123 A1 Dec. 5, 2024

(51) Int. Cl.

| | |
|---|---|
| ***H10D 30/65*** | (2025.01) |
| ***H10D 30/01*** | (2025.01) |
| ***H10D 62/10*** | (2025.01) |

(52) U.S. Cl.

CPC ......... *H10D 30/65* (2025.01); *H10D 30/0281* (2025.01); *H10D 62/126* (2025.01); *H10D 62/10* (2025.01)

(58) Field of Classification Search

CPC .... H10D 62/126; H10D 62/10; H10D 30/603; H10D 64/112; H10D 62/116; H10D 64/111; H10D 64/516; H10D 30/0281–0289; H10D 30/65–659; H01L 21/76224–76237; H01L 21/76202–76221; H10W 10/014–0148

See application file for complete search history.

(56) References Cited

U.S. PATENT DOCUMENTS

| | | | | |
|---|---|---|---|---|
| 8,158,475 | B2 | 4/2012 | Su et al. | |
| 9,190,535 | B2 | 11/2015 | Yeh et al. | |
| 11,004,844 | B2 | 5/2021 | Chen et al. | |
| 11,069,804 | B2 | 7/2021 | Pala | |
| 11,205,722 | B2 | 12/2021 | Lian et al. | |
| 11,322,609 | B2 | 5/2022 | Wang et al. | |
| 11,508,757 | B2 | 11/2022 | Chiang et al. | |
| 2016/0099349 | A1* | 4/2016 | Parris .................. | H10D 62/107 438/286 |

(Continued)

FOREIGN PATENT DOCUMENTS

| | | | |
|---|---|---|---|
| CN | 217239434 U | * | 8/2022 |

*Primary Examiner* — Shahed Ahmed

(74) *Attorney, Agent, or Firm* — NZ Carr Law Office

(57) ABSTRACT

A high-voltage device structure and methods of forming the same are described. In some embodiments, the structure includes a deep well region of a first conductivity type disposed in a substrate, a doped region disposed on the deep well region; a well region of the first conductivity type surrounding the deep well region and the doped region; a source region disposed on the well region, a drain region disposed on the doped region, and a first pickup region of the first conductivity type disposed on the well region. The first pickup region is laterally in contact with the source region, and the first pickup region, the well region, and the deep well region are electrically connected.

20 Claims, 17 Drawing Sheets

(56) References Cited

U.S. PATENT DOCUMENTS

| | | | | |
|---|---|---|---|---|
| 2016/0099359 | A1 * | 4/2016 | Goris | H10F 71/00<br>438/98 |
| 2016/0181419 | A1 | 6/2016 | Ryu et al. | |
| 2017/0194314 | A1 * | 7/2017 | Lee | H10D 89/713 |
| 2022/0052156 | A1 | 2/2022 | Kim | |
| 2022/0310388 | A1 | 9/2022 | Lin et al. | |
| 2023/0380136 | A1 * | 11/2023 | Liu | H10B 12/50 |

* cited by examiner

HIGH VOLTAGE DEVICE STRUCTURE AND METHODS OF FORMING THE SAME

BACKGROUND

High-Voltage Metal-Oxide-Semiconductor (HVMOS) devices are widely used in many electrical devices, such as Central Processing Unit (CPU) power supplies, power management systems, AC/DC converters, etc. During operation of HVMOS devices, high voltages may be applied between the gate and the drain. As a result, substantial substrate leakage and device damage often occur. Therefore, an improved HVMOS device is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
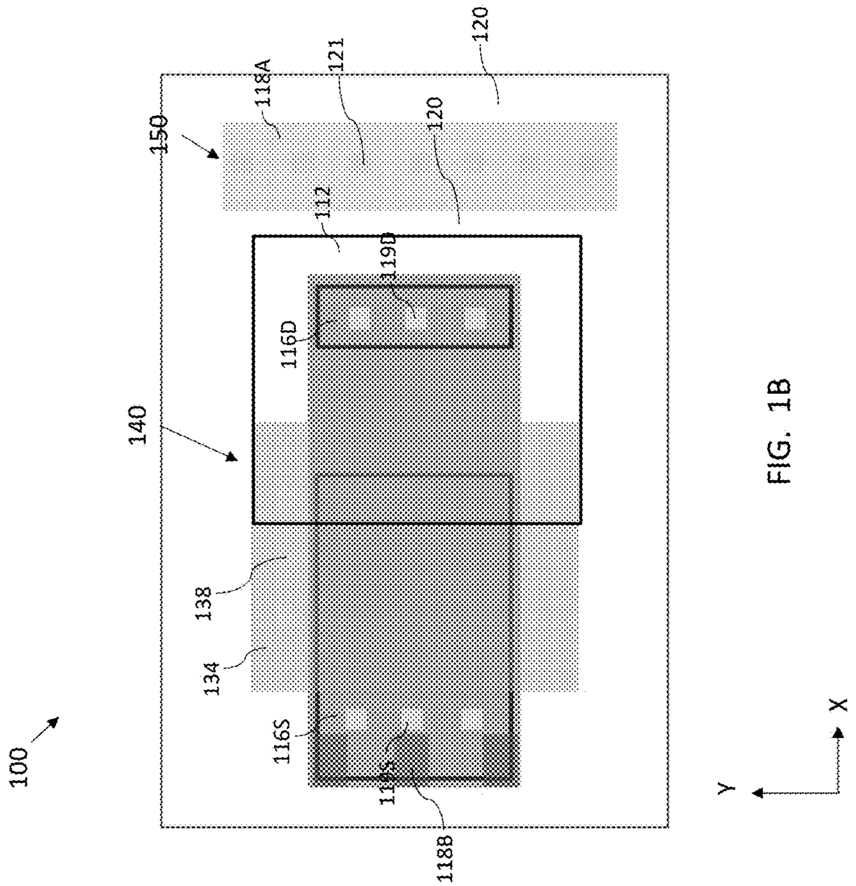
FIGS. 1A and 1B illustrate top views of a high-voltage device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high-voltage device structure including a guard structure and methods of forming the same are provided in accordance with some embodiments of the present disclosure. In some embodiments, the high-voltage device is a HVMOS transistor, and the guard structure includes a pickup region butted against the source region. The guard structure with the pickup region butted against the source region leads to smaller guard structure, which in turn saves layout area. In some embodiments, the HVMOS device includes one or more isolation regions, such as shallow trench isolation (STI) regions or deep trench isolation (DTI) regions, and one or more conductive layers are formed in the isolation regions to improve deep n-well (DNW)-isolation (ISO) pickup efficiency.

Figure 1A:
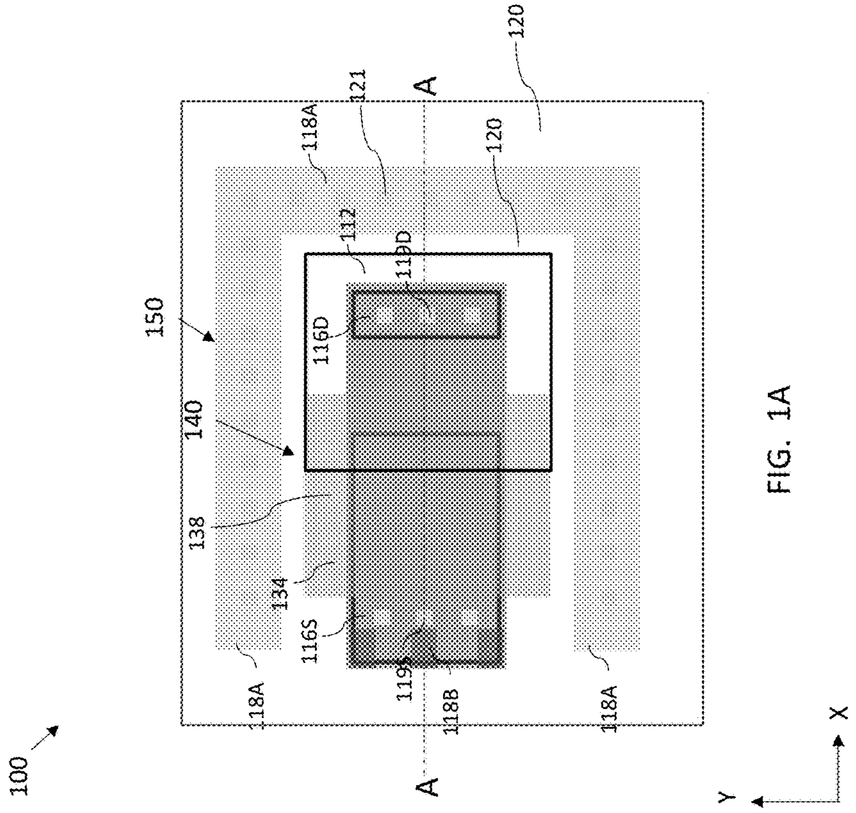
Figure 2:
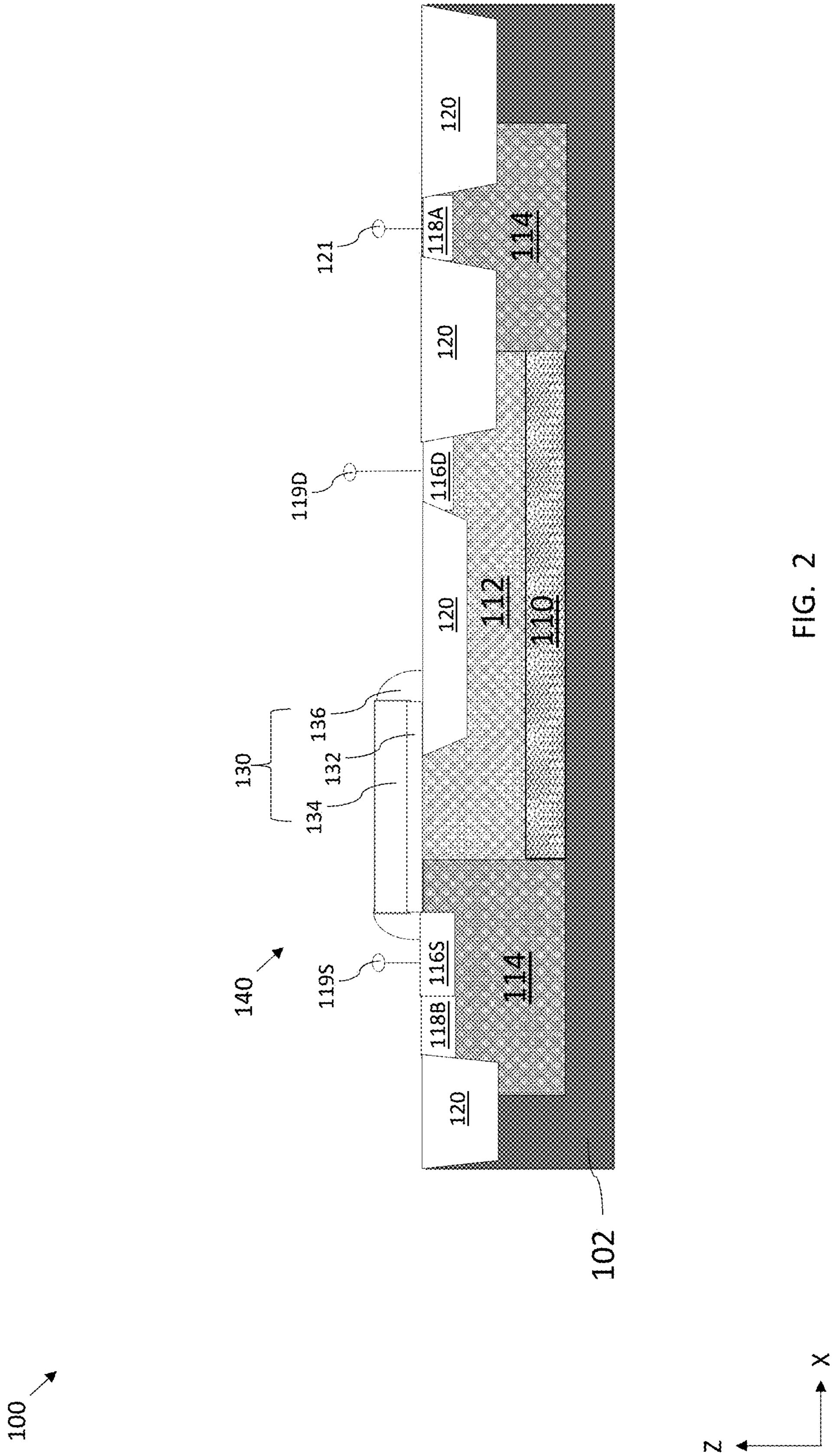
FIG. 2 illustrates a cross-sectional view of the high-voltage device structure taken along cross-section A-A of FIG. 1A, in accordance with some embodiments.

FIGS. 1A and 1B illustrates a top view of a high-voltage device structure 100, in accordance with some embodiments. FIG. 2 illustrates a cross-sectional view of the high-voltage device structure 100 taken along cross-section A-A of FIG. 1A, in accordance with some embodiments. As shown in FIG. 2, in some embodiments, the high-voltage device structure 100 includes a substrate 102. The substrate 102 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may be a SiGe alloy with a gradient Ge feature in which the Si and Ge composition changes from one ratio at one location to another ratio at another location. In another embodiment, the SiGe alloy is formed over a silicon substrate. In some embodiments, a SiGe alloy can be mechanically strained by another material in contact with the SiGe alloy. Furthermore, the substrate 102 may be a semiconductor on insulator, such as silicon on insulator (SOI). In some embodiments, the substrate 102 may include a doped epitaxial layer. In some embodiments, the substrate 102 may have a multilayer structure, or the substrate 102 may include a multilayer compound semiconductor structure. In some embodiments, the substrate 102 is doped with a p-type dopant, such as boron (B), other group III elements, or any combination thereof.

The high-voltage device structure 100 includes a deep well region 110 disposed in the substrate 102. In some embodiments, the deep well region 110 includes a first conductivity type, and the substrate 102 includes the same conductivity type. In some embodiments, the deep well region 110 includes the first conductivity type, and the substrate 102 includes a second conductivity type. The first conductivity type and the second conductivity type are opposite to each other. In some embodiments, the first conductivity type is a p type, and the second conductivity type is an n type. In some embodiments, n-type dopants include arsenic (As), phosphorus (P), other group V elements, or any combination thereof, and p-type dopants include boron (B), other group III elements, or any combination thereof. Although the substrate 102 and the deep well region 110 include the same type of dopants, a doping concentration of the deep well region 110 may be greater than a doping concentration of the substrate 102.

A doped region 112 is disposed on the deep well region 110. The doped region 112 includes a conductivity type opposite the conductivity type of the deep well region 110. In some embodiments, the doped region 112 is a high-voltage n-type doped region (HVNDD), the deep well region is a p-type deep well region (DPW), and the substrate 102 is a p-type substrate. In some embodiments, the deep well region 110 and the doped region 112 are formed by an implantation process. In other words, the deep well region 110 and the doped region 112 may be co-implanted. For example, a patterned mask is first formed on the substrate 102, and the doped region 112 is exposed. P-type dopants are then implanted in the deep well region 110, followed by implanting n-type dopants in the doped region 112.

The high-voltage device structure 100 may further include a well region 114 surrounding the deep well region 110 and the doped region 112. In some embodiments, the well region 114 includes the same conductivity type as the deep well region 110. For example, the well region 114 may be a p-type well region (SHP), and the deep well region is a DPW. As described below, the well region 114 and the deep well region 110 are part of a guard structure that electrically isolates a device, such as a HVMOS transistor, from neighboring devices (due to the p-n junction between the deep well region 110 and the doped region 112). In some embodiments, the dopant concentration of the deep well region 110 is substantially greater than the dopant concentration of the well region 114. As a result, electrical isolation is improved. In some embodiments, the dopant concentration of the deep well region 110 is substantially less than the dopant concentration of the well region 114. As a result, breakdown voltage is improved, which in turn improves device performance.

As shown in FIGS. 1A, 1B, and 2, the high-voltage device structure 100 includes a source region 116S and a drain region 116D. In some embodiments, the source region 116S is formed on the well region 114, and the drain region 116D is formed on the doped region 112, as shown in FIG. 2. The source region 116S and the drain region 116D may be formed simultaneously in a same implantation process. In some embodiments, the source region 116S and the drain region 116D are of n-type, and are heavily doped, for example, to an n-type impurity concentration between about $10^{19}/cm^3$ and about $10^{21}/cm^3$, and are referred to as N+ regions. A photo resist (not shown) is formed to define the locations of source region 116S and the drain region 116D.

As shown in FIGS. 1A, 1B, and 2, conductive contacts 119D are formed over the drain region 116D, and conductive contacts 119S are formed over the source region 116S. The conductive contacts 119S, 119D may include an electrically conductive material, such as TiN, W. Ru, Mo, Co, Cu, or other suitable electrically conductive material. Additionally, a silicide layer (not shown) can be formed between the conductive contact 119S and the source region 116S and between the conductive contact 119D and the drain region 116D. The silicide layer may include materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridum silicide (IrSi), erbium silicide (ErSi), cobalt silicide (CoSi), other suitable materials, or a combination thereof. As shown in FIGS. 1A and 1B, three conductive contacts 119S and three conductive contacts 119D are shown. However, the number of conductive contacts 119S, 119D may be any suitable number and is not limited to three.

As shown in FIGS. 1A, 1B, and 2, pickup regions 118A, 118B are formed at the surface of the well region 114 through an additional implantation step. In some embodiments, the conductivity type of the pickup regions 118A, 118B is opposite of the conductivity type of the source and drain regions 116S, 116D. For example, the pickup regions 118A, 118B are of p-type, and are heavily doped, for example to a p-type impurity concentration between about $10^{19}/cm^3$ and about $10^{21}/cm^3$, and are referred to as P+ regions. A photo resist (not shown) is formed to define the locations of the pickup regions 118A, 118B, and the pickup regions 118A, 118B may be formed simultaneously in a same implantation process.

In some embodiments, conductive contacts 121 are formed over the pickup region 118A. The conductive contacts 121 may include the same material as the conductive contacts 119S. 119D. A silicide layer (not shown) can be formed between the conductive contact 121 and the pickup region 118A. In some embodiments, the pickup region 118B and the source region 116S laterally contact each other. In other words, the pickup region 118B and the source region 116S are butted against each other. A single silicide layer may be formed on the pickup region 118B and the source region 116S, and the pickup region 118B and the source region 116S may share the same conductive contact 119S.

As shown in FIG. 2, the high-voltage device structure 100 includes one or more isolation regions 120. In some embodiments, the isolation regions 120 are formed by forming trenches in the substrate 102, the well region 114, and the doped region 112, filling the trenches with a dielectric material, such as $SiO_2$, high-density plasma (HDP) oxide, or other suitable dielectric material, and performing a planarization process, such as a chemical mechanical polish, to level the surface of the filled dielectric material. The resulting isolation regions 120 may be shallow trench isolation (STI) regions. As shown in FIGS. 1A and 1B, some isolation regions 120 may be omitted for clarity. In some embodiments, the outer isolation region 120 is a closed loop or frame-like.

As shown in FIG. 2, the high-voltage device structure 100 further includes a gate structure 130. The gate structure 130 includes a gate electrode layer 134 and a gate dielectric layer 132 between the gate electrode layer 134 and the substrate 102. The gate electrode layer 134 includes an electrically conductive material, such as polysilicon, silicon-germanium, and/or at least one metallic material including elements and compounds such as Mo, Cu, W, Ti, Ta, TiN, TaN, NiSi, CoSi, or other suitable conductive materials known in the art. In some embodiments, the gate electrode layer 134 includes a work function metal layer (not shown) that provides a metal gate with an n-type-metal work function or p-type-metal work function. The p-type-metal work function materials include materials such as ruthenium, palladium, platinum, cobalt, nickel, conductive metal oxide, or other suitable materials. The n-type-metal work function materials include materials such as hafnium, zirconium, titanium, tantalum, aluminum, metal carbides (e.g., hafnium carbide, zirconium carbide, titanium carbide, and aluminum carbide), aluminides, or other suitable materials.

The gate dielectric layer 132 may be a single layer or a multi-layer structure. In some embodiments, the gate dielectric layer 132 is a multi-layer structure that includes an interfacial layer and a high-k dielectric layer. The interfacial layer may include dielectric material such as silicon oxide, silicon nitride, silicon oxynitride, other dielectric material, or a combinations thereof. The high-k dielectric layer can include high-k dielectric material such as $HfO_2$, HfSiO, HfSiON, HfTaO, HfTiO, HfZrO, other suitable high-k dielectric materials, or a combinations thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

In some embodiments, the gate structure 130 may include gate spacers 136 disposed over sidewalls of the gate electrode layer 134 and the gate dielectric layer 132. The gate spacers 136 may be a single layer or a multi-layer structure. In some embodiments, the gate spacers 136 includes a silicon oxide layer and a silicon nitride layer. The formation of the gate spacers 136 may include depositing blanket dielectric layers, and then performing an anisotropic etching to remove the horizontal portions of the blanket dielectric layers. The gate electrode layer 134 may be disposed over the well region 114, the doped region 112, and the isolation region 120, as shown in FIG. 2. In some embodiments, the gate spacers 136 may be disposed on the source region 116S.

As shown in FIGS. 1A and 1B, the gate spacers 136 are omitted for clarity. One or more conductive contacts 138 are formed over the gate electrode layer 134. The conductive contact 138 may include the same material as the conductive contacts 119S, 119D. The number of conductive contacts 138 may be any suitable number.

The gate structure 130, the source region 116S, and the drain region 116D may form a device 140. The device 140 may be a transistor, such as a HVMOS transistor. In some embodiments, a voltage greater than about 10 V, such as about 20 V or higher, may be applied to the conductive contact 119D.

The pickup regions 118A, 118B, the well region 114, and the deep well region 110 form the above mentioned guard structure 150 to electrically isolate the device 140. By forming the pickup region 118B to be laterally in contact with the source region 116S and electrically connect the pickup region 118B to the pickup region 118A, the layout area may be reduced. In other words, the pickup region 118B and the source region 116S are merged to save the layout area. In some embodiments, as shown in FIG. 1A, the pickup region 118A may include three sides partially surrounding the device 140. In some embodiments, the pickup region 118A is disposed on the opposite side of the pickup region 118B.

Figure 3A:
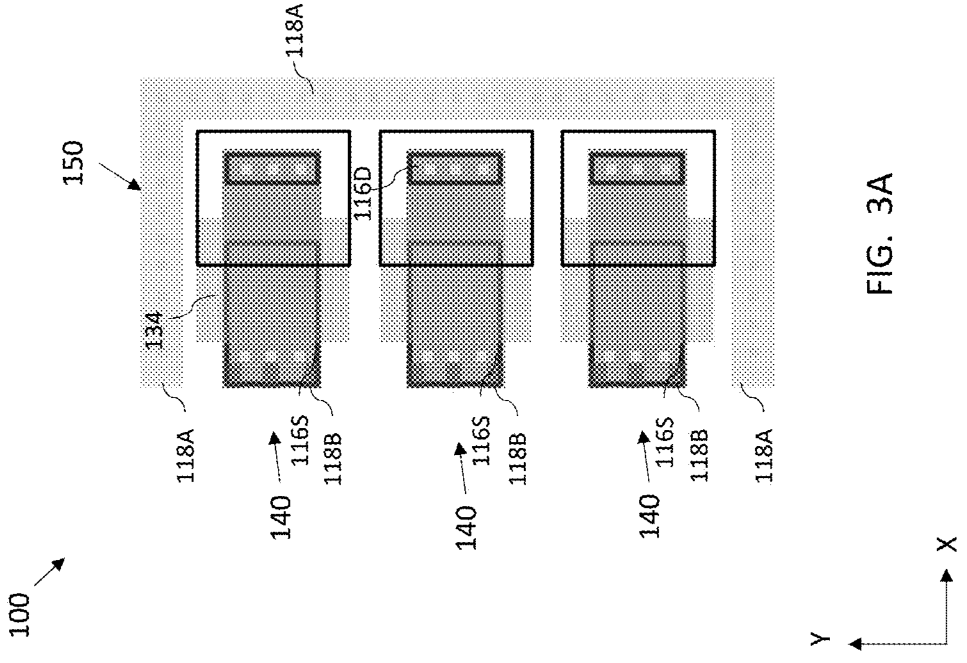
FIGS. 3A-3C illustrate top views of the high-voltage device structure, in accordance with some embodiments.
Figure 3B:
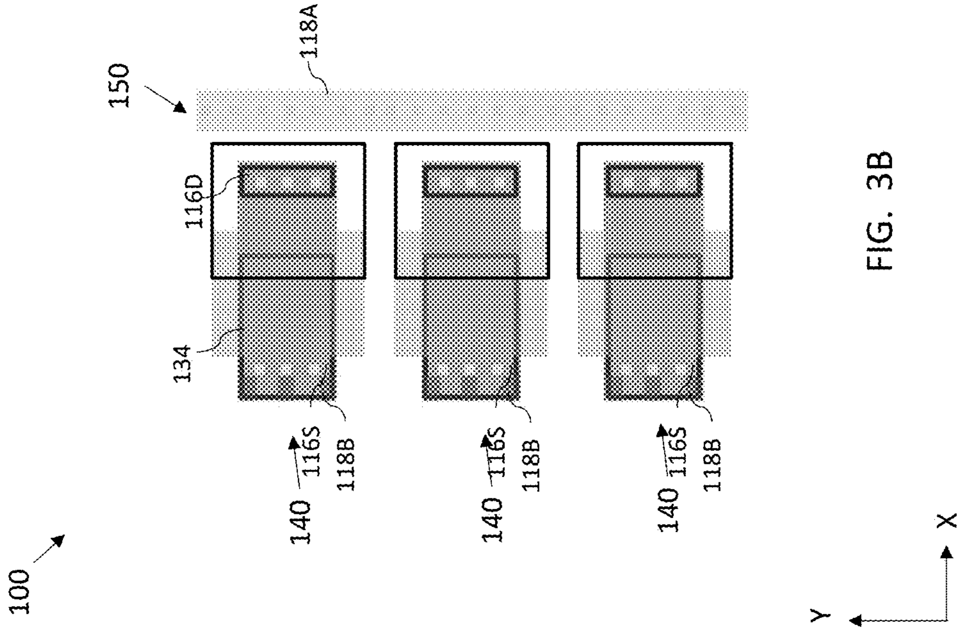
Figure 3C:
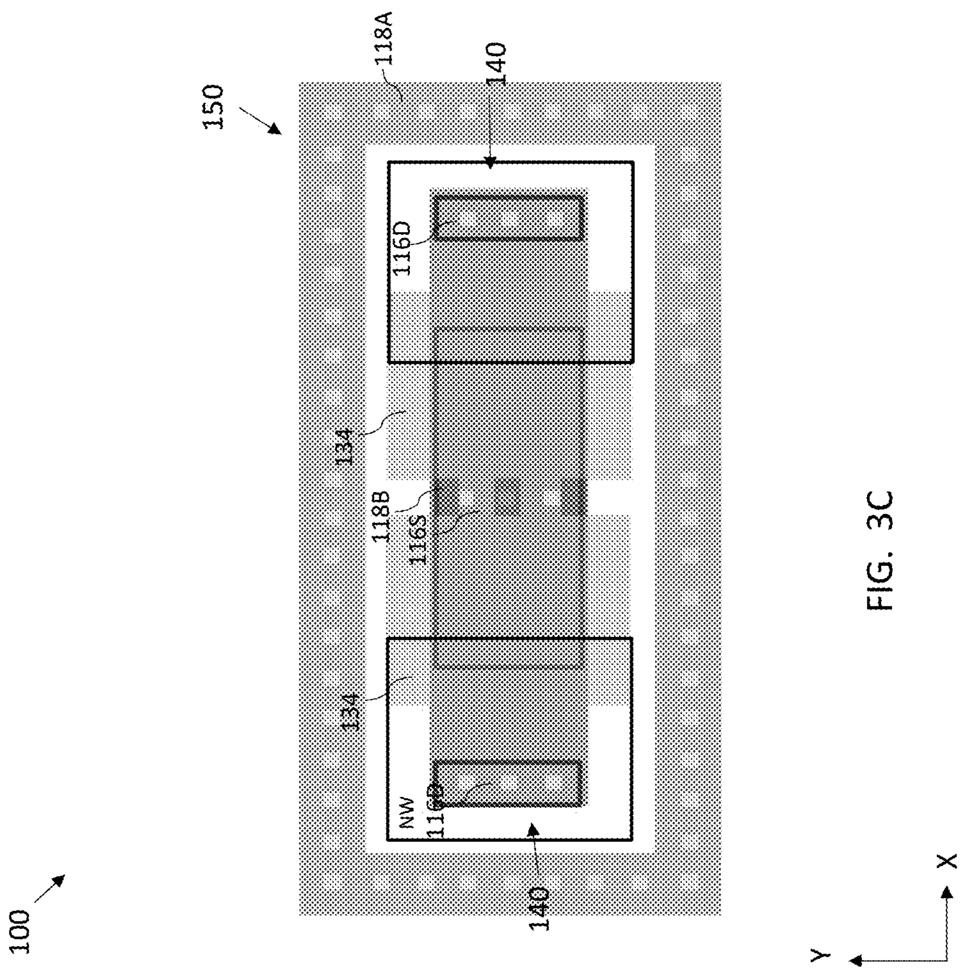

FIGS. 3A-3C illustrate top views of the high-voltage device structure 100, in accordance with some embodiments. As shown in FIG. 3A, the high-voltage device structure 100 includes multiple devices 140 partially surrounded by the pickup region 118A of the guard structure 150. Each device 140 includes the pickup region 118B butted against the source region 116S. Each pickup region 118B is electrically connected to the pickup region 118A via the deep well region 110 and the well region 114 (FIG. 2). As shown in FIG. 3B, the pickup region 118A of the guard structure 150 is disposed adjacent multiple devices 140. For example, the pickup region 118A is disposed adjacent to the drain region 116D of each device 140, and the source region 116S of each device 140 is laterally in contact with the pickup region 118B. Each pickup region 118B is electrically connected to the pickup region 118A via the deep well region 110 and the well region 114 (FIG. 2).

As shown in FIG. 3C, two devices 140 are butted against each other and share the source regions 116S and the pickup regions 118B. The pickup region 118A completely surround the two devices 140. Each pickup region 118B is electrically connected to the pickup region 118A via the deep well region 110 and the well region 114 (FIG. 2). The guard structure 150 in FIGS. 3A to 3C electrically isolates two or more devices 140 from neighboring devices. The merged pickup region 118B and the source region 116S may save the array layout area in FIGS. 3A and 3B. The merged pickup region 118B and the source region 116S of two devices 140 shown in FIG. 3C can save the multi-finger area and can enhance electrostatic discharge protection.

Figure 4B:
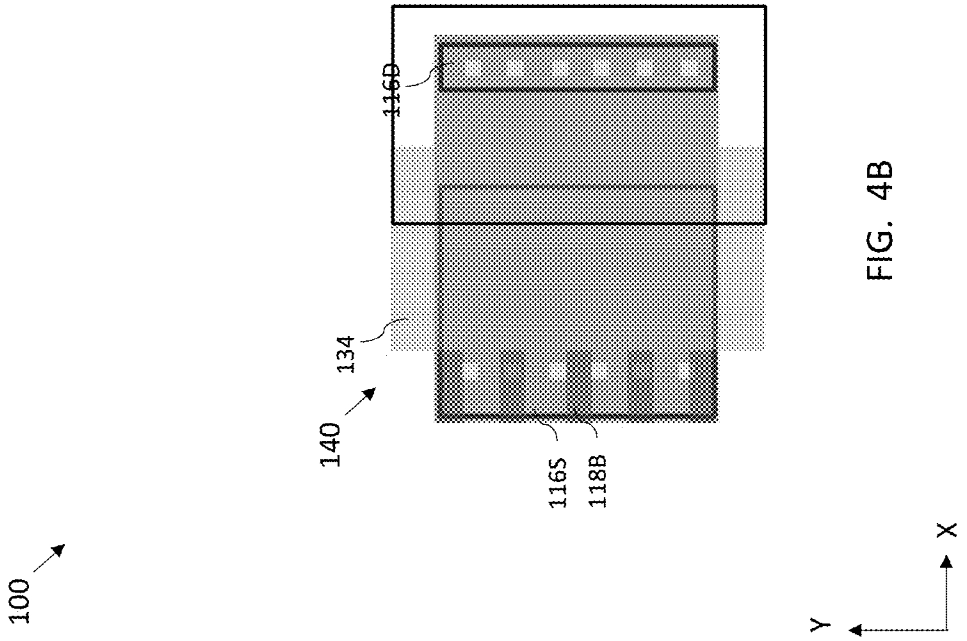
FIGS. 4A and 4B illustrate top views of the high-voltage device structure, in accordance with some embodiments.
Figure 4A:
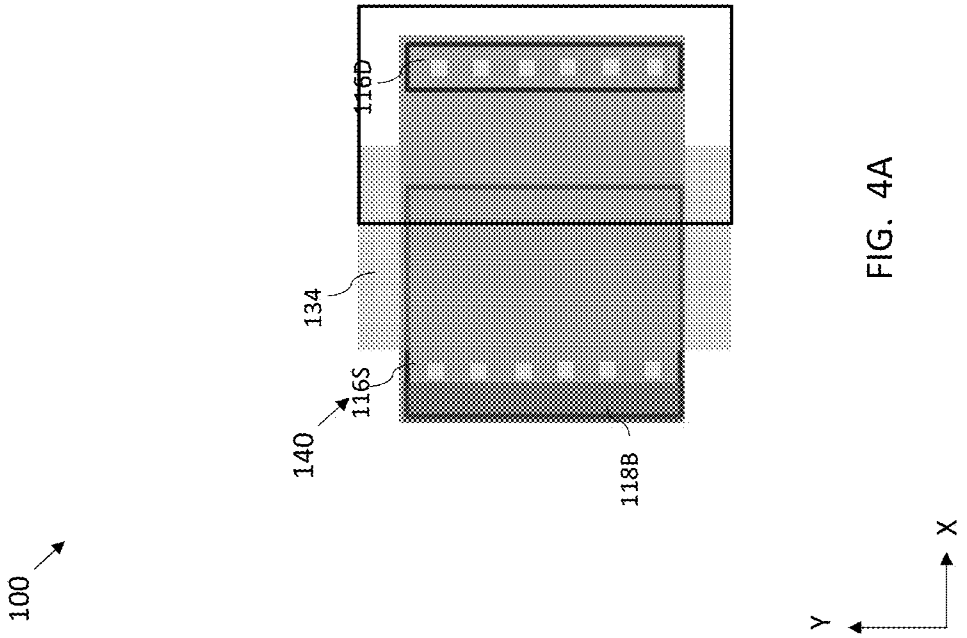

FIGS. 4A and 4B illustrate top views of the high-voltage device structure 100, in accordance with some embodiments. The pickup region 118A is omitted in FIGS. 4A and 4B for clarity. In some embodiments, as shown in FIG. 4A, the guard structure 150 includes a single continuous pickup region 118B that is laterally in contact with the source region 116S of the device 140 in a first axis (x-axis). As shown in FIG. 4B, the guard structure 150 includes a plurality of pickup regions 118B interposed with a plurality of source regions 116S in a second axis (y-axis) substantially perpendicular to the first axis. Each of the plurality of pickup regions 118B may extend to a sidewall of the gate electrode layer 134. In some embodiments, the pickup regions 118B shown in FIG. 4B are disposed under the gate spacers 136 (FIG. 2). The ratio of the pickup region 118B to the source region 116S may be one to one, as shown in FIG. 4B. The ratio may range between one to one and one to four. The continuous pickup region 118B shown in FIG. 4A can lead to decreased source resistance. However, electrostatic discharge and electrical safe operation area may be negatively impacted by the continuous pickup region 118B. The plurality of discrete pickup regions 118B shown in FIG. 4B can lead to improved electrostatic discharge and electrical safe operation area. However, source resistance is negatively impacted by the plurality of discrete pickup regions 118B.

Figure 5:
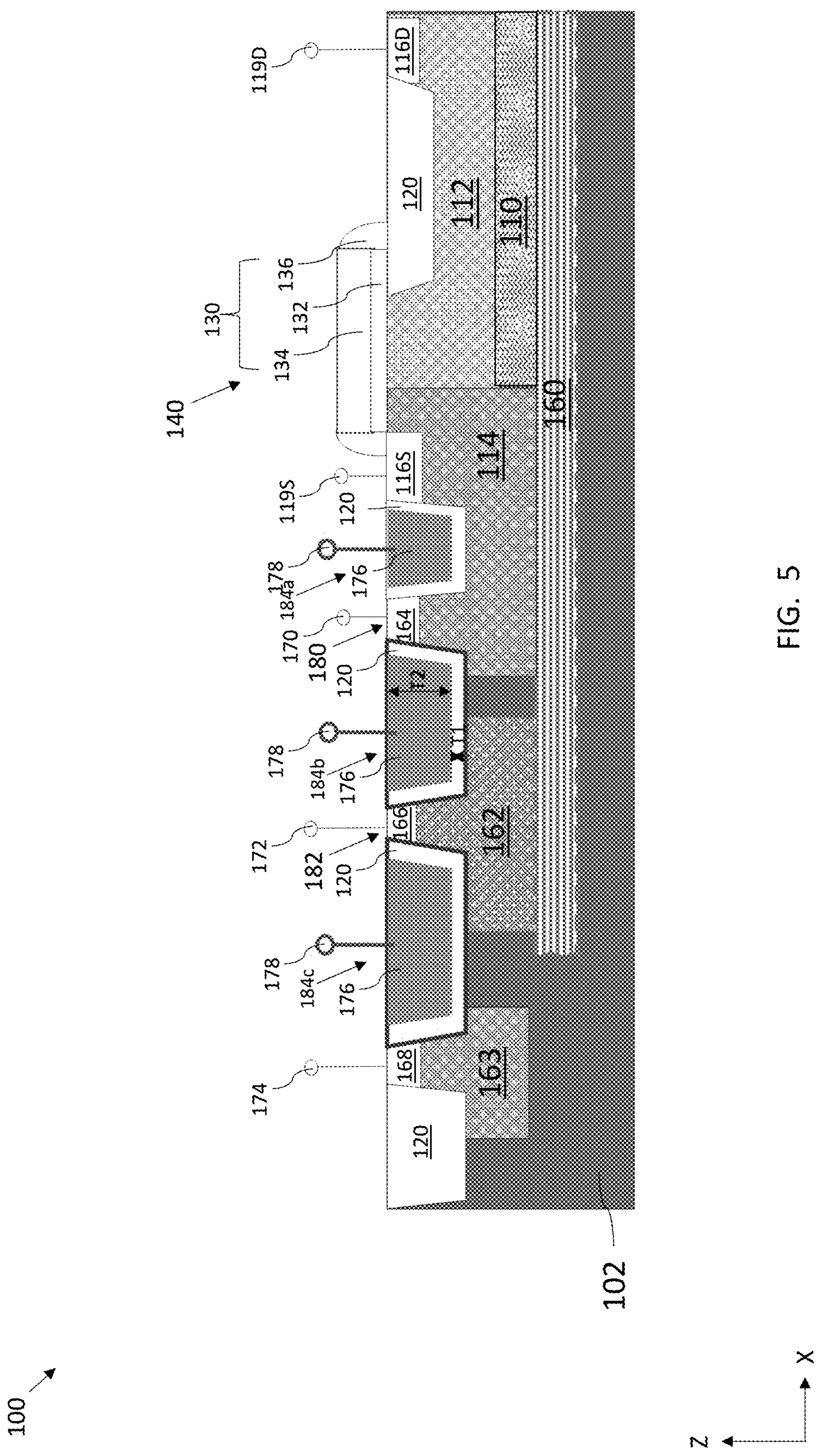
FIGS. 5-14 illustrate cross-sectional side views of the high-voltage device structure, in accordance with alternative embodiments.

FIGS. 5-12 illustrate cross-sectional side views of the high-voltage device structure 100, in accordance with alternative embodiments. As shown in FIG. 5, in some embodiments, the pickup region 118B is not present and is replaced with a pickup region 164. The pickup region 164 may include the same conductivity type and dopant concentration as the pickup region 118B. The pickup region 164 is separated from the source region 116S by a first isolation structure 184*a*. The first isolation structure 184*a* will be described in detail below.

In some embodiments, the high-voltage device structure 100 includes a second deep well region 160 disposed under the deep well region 110 and the well region 114. The second deep well region 160 has a conductivity type opposite the conductivity type of the deep well region 110 and the well region 114. In some embodiments, the deep well region 160 is n-type, the deep well region 110 is p-type, and the well region is p-type. A second well region 162 is formed in the substrate 102 and on the deep well region 160. The well region 162 includes the same conductivity type as the deep well region 160. In some embodiments, the well region 162 is n-type. A pickup region 166 is formed on the well region 162. The pickup region 166 includes the same conductivity type as the well region 162. In some embodiments, the pickup region 166 is n-type. In some embodiments, the pickup region 166 may be referred to as N+ regions.

In some embodiments, the high-voltage device structure 100 further includes a well region 163 formed in the substrate 102, and a pickup region 168 formed on the well region 163. The well region 163 may have the same conductivity type and dopant concentration as the well region 114, and the pickup region 168 may have the same conductivity type and dopant concentration as the pickup region 164. In some embodiments, the pickup region 168 may be referred to as P+ regions.

In some embodiments, the high-voltage device structure 100 includes a first guard structure 180 surrounding the device 140, which may include the source region 116S, the drain region 116D, and the gate structure 130. In some embodiments, the first guard structure 180 includes the pickup region 164, the well region 114 (with only a portion shown in FIG. 5), the deep well region 110, and a pickup region (not shown) formed on the portion of the well region 114 that is not shown in FIG. 5, which may be the pickup region 118A (FIG. 2). The layout area of the high-voltage device structure 100 is larger than the layout area of the high-voltage device structure 100 shown in FIG. 2, because the first isolation structure 184*a* is formed between the pickup region 164 and the source region 116S. In some embodiments, the high-voltage device structure 100 further includes a second guard structure 182 surrounding the first guard structure 180. The second guard structure 182 includes the pickup region 166, the well region 162 (with only a portion shown in FIG. 5), the deep well region 160 (with only a portion shown in FIG. 5), and a pickup region (not shown) formed on the portion of the well region 162 that is not shown in FIG. 5. Each guard structure 180, 182 includes regions having the same conductivity type.

As shown in FIG. 5, the pickup region 164 of the guard structure 180 and the pickup region 166 of the guard structure 182 are separated by a second isolation structure 184*b*. The pickup region 166 of the guard structure 182 and the pickup region 168 are separated by a third isolation structure 184*c*. Each isolation structure 184*a*, 184*b*, 184*c* includes the isolation region 120 and a conductive layer 176. Each conductive layer 176 may include an electrically conductive material, such as a metal or metal nitride. By applying a voltage, such as a positive voltage, to the conductive layers 176 of the isolation structures 184*a*, 184*b*, 184*c*, smooth electric fields are created around the guard structures 180, 182, which in turn enhances the electrical isolation properties of the guard structures 180, 182. Furthermore, pickup efficiency at the pickup regions 164, 166 is enhanced. In some embodiments, each isolation region 120 has a thickness T1 ranging from about 20 nm to about 100 nm, and each conductive layer 176 has a thickness ranging from about 200 nm to about 280 nm. The thickness T1 may be about 10 percent to about 50 percent of the thickness T2. If the thickness T1 is less than about 10 percent of the thickness T2, the conductive layer 176 and the neighboring well regions 114, 162, 163 may not be sufficiently isolated. On the other hand, if the thickness T1 is greater than about 50 percent of the thickness T2, the benefits of having the conductive layer 176 may be reduced.

As described above, the isolation structures 184*a*, 184*b*, 184*c* may be closed loop or frame-like. In some embodiments, each conductive layer 176 is also closed loop and frame-like. In some embodiments, each isolation structure 184*a*, 184*b*, 184*c* includes a plurality of discrete conductive layers 176 disposed in the corresponding isolation region 120. In some embodiments, each isolation structure 184*a*, 184*b*, 184*c* includes one or more continuous conductive layers 176 disposed in one or more sides of the isolation region 120.

A plurality of conductive contacts 170, 172, 174 are formed over the pickup regions 164, 166, 168, respectively. A plurality of conductive contacts 178 are formed over corresponding isolation structures 184*a*, 184*b*, 184*c*. The conductive contacts 170, 172, 174, 178 may include the same material as the conductive contact 119S.

Figure 6:
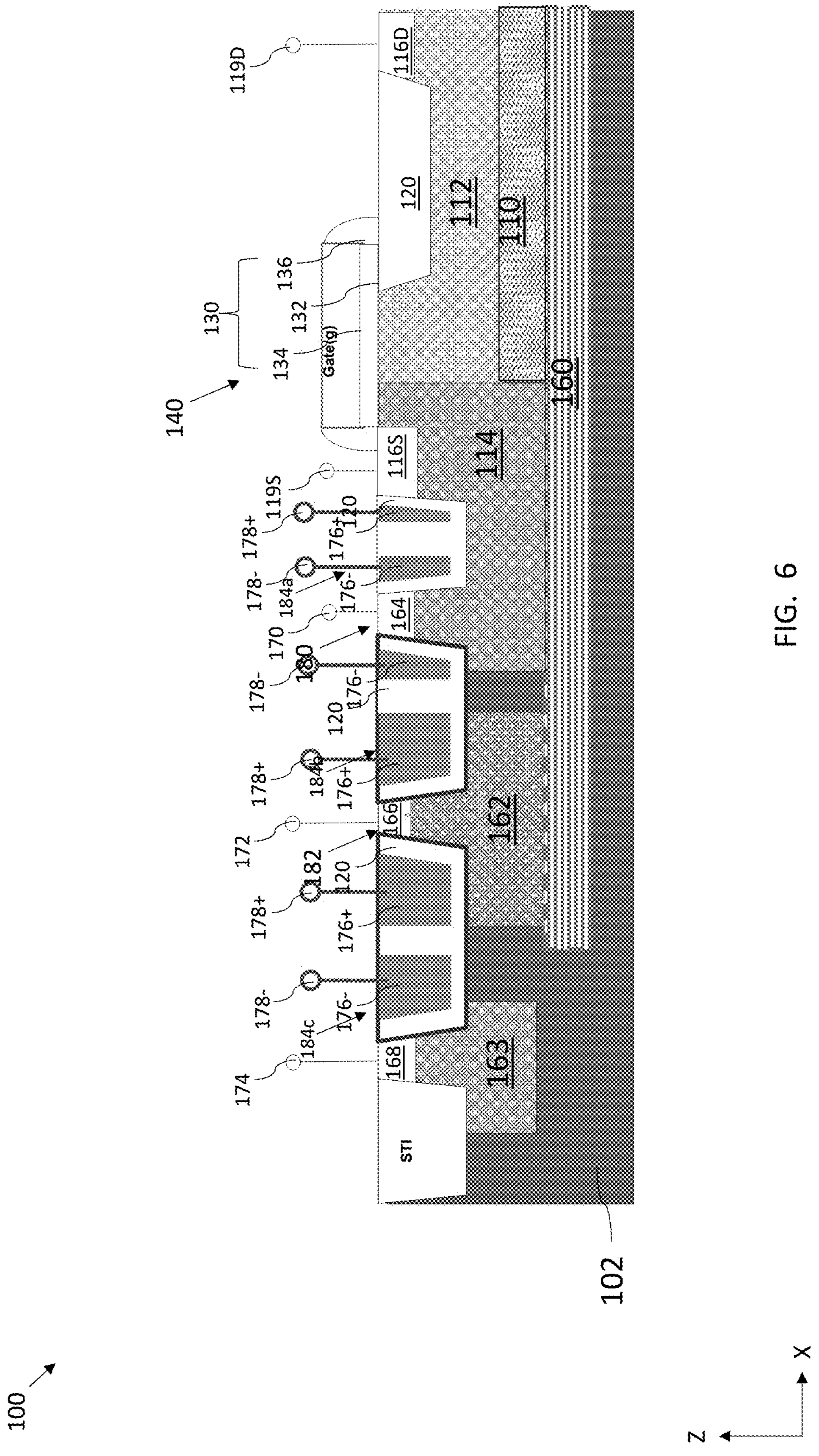

In some embodiments, each isolation structure includes two discrete conductive layers 176+, 176− disposed in a single isolation region 120, as shown in FIG. 6. For example, in an isolation region 120 disposed between a p-type well region, such as the well region 114, and an n-type well region, such as the well region 162, the conductive layer 176− is disposed adjacent to the p-type well region, while the conductive layer 176+ is disposed adjacent to the n-type well region, as shown in FIG. 6. During operation, a positive voltage is applied to the conductive layer 176+, and a negative voltage is applied to the conductive layer 176−. As a result, smooth electric fields are created to help the guard structures 180, 182 to electrically isolate the device 140. Conductive contacts 178+, 178− are formed over corresponding conductive layers 176+, 176−.

Figure 7:
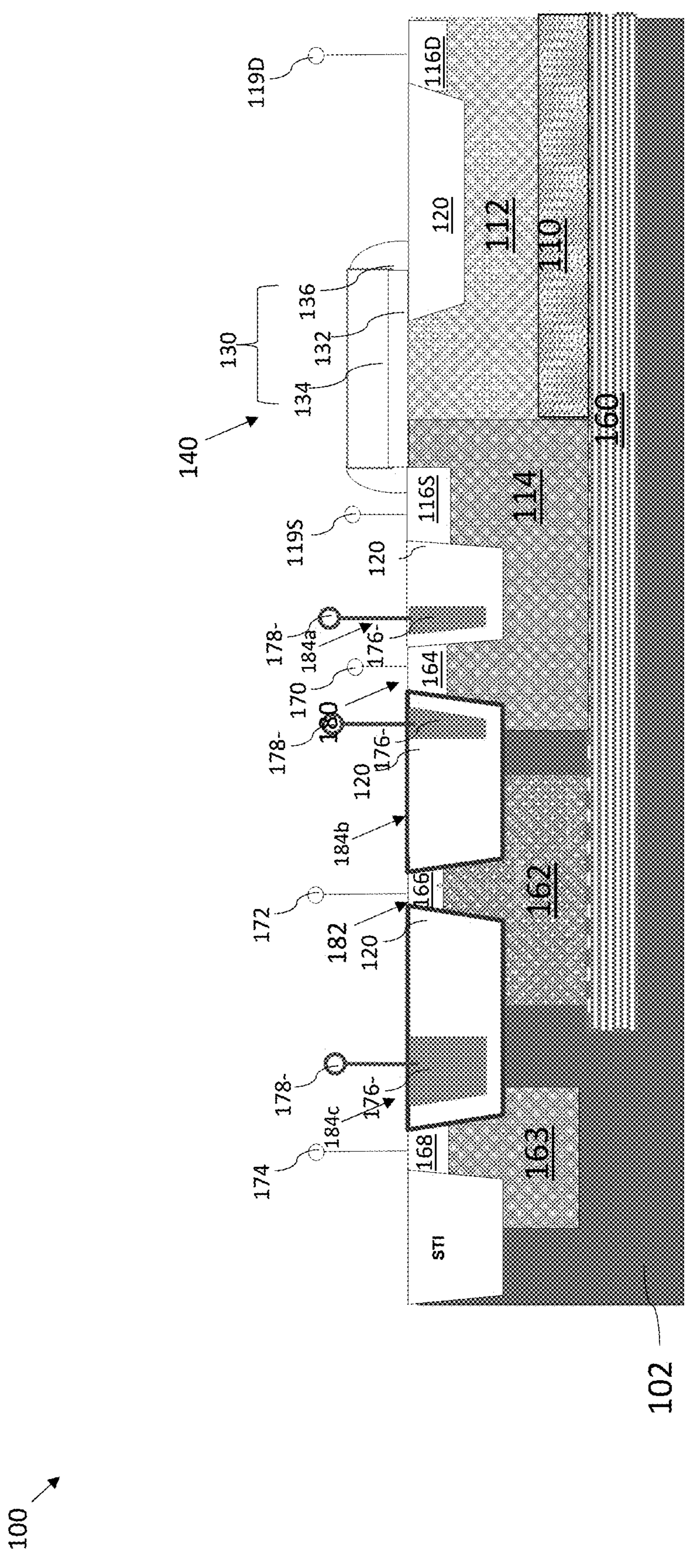
Figure 8:
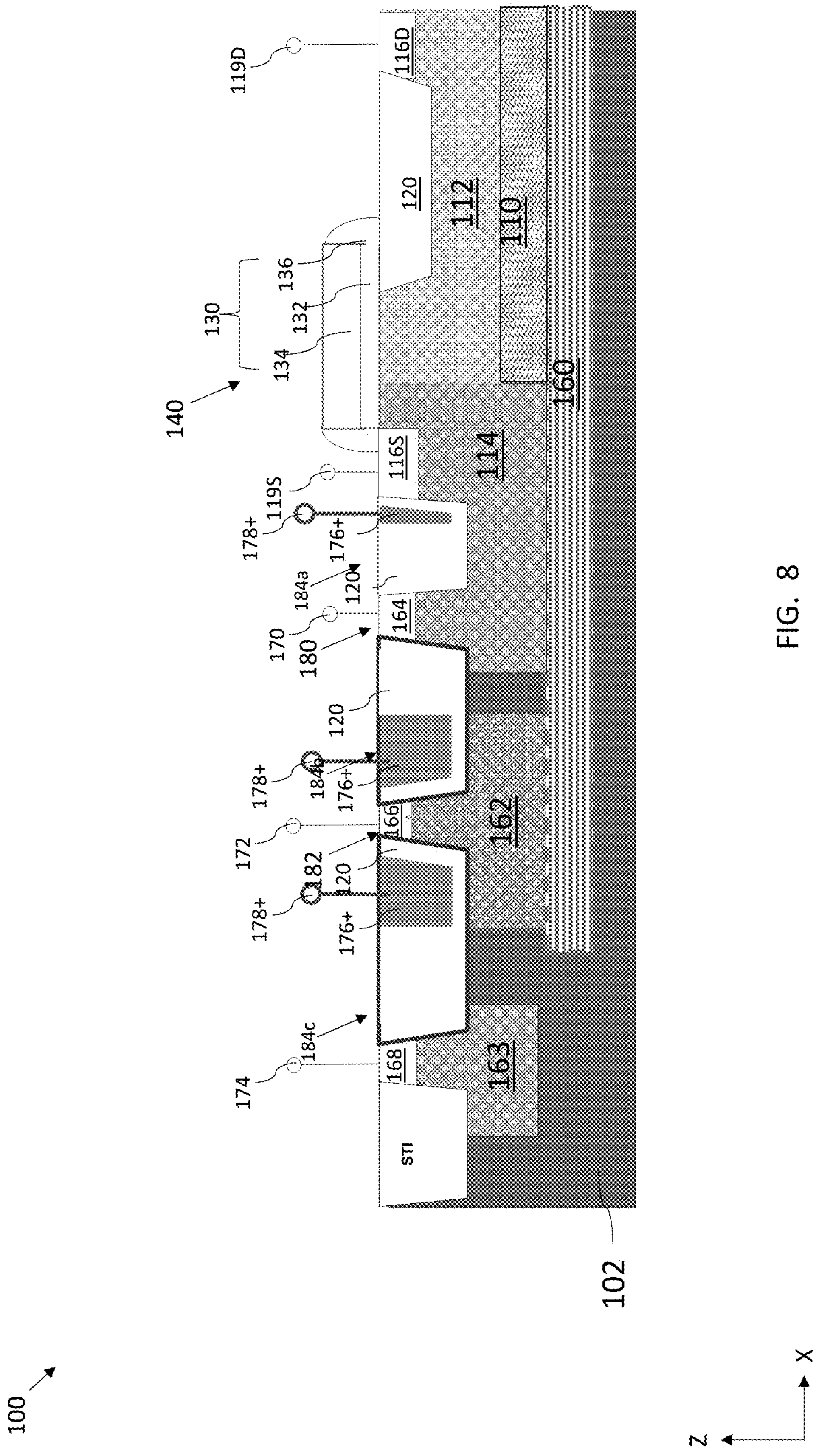

In some embodiments, the conductive layers 176+ are not present, and each isolation structure 184*a*, 184*b*, 184*c* includes the conductive layer 176− disposed in the isolation region 120 adjacent to a p-type well region, such as the well regions 114, 163, as shown in FIG. 7. The conductive contacts 178+ are also not present. In some embodiments, the conductive layers 176− are not present, and each isolation structure 184*a*, 184*b*, 184*c* includes the conductive layer 176+ disposed in the isolation region 120 adjacent to an n-type well or doped region, such as the well regions 162 and the source region 116S, as shown in FIG. 8. The conductive contacts 178− are also not present. In other words, the conductive layer 176+ or 176− may be formed asymmetrically in the isolation region 120 with respect to the x-z plane.

Figure 9:
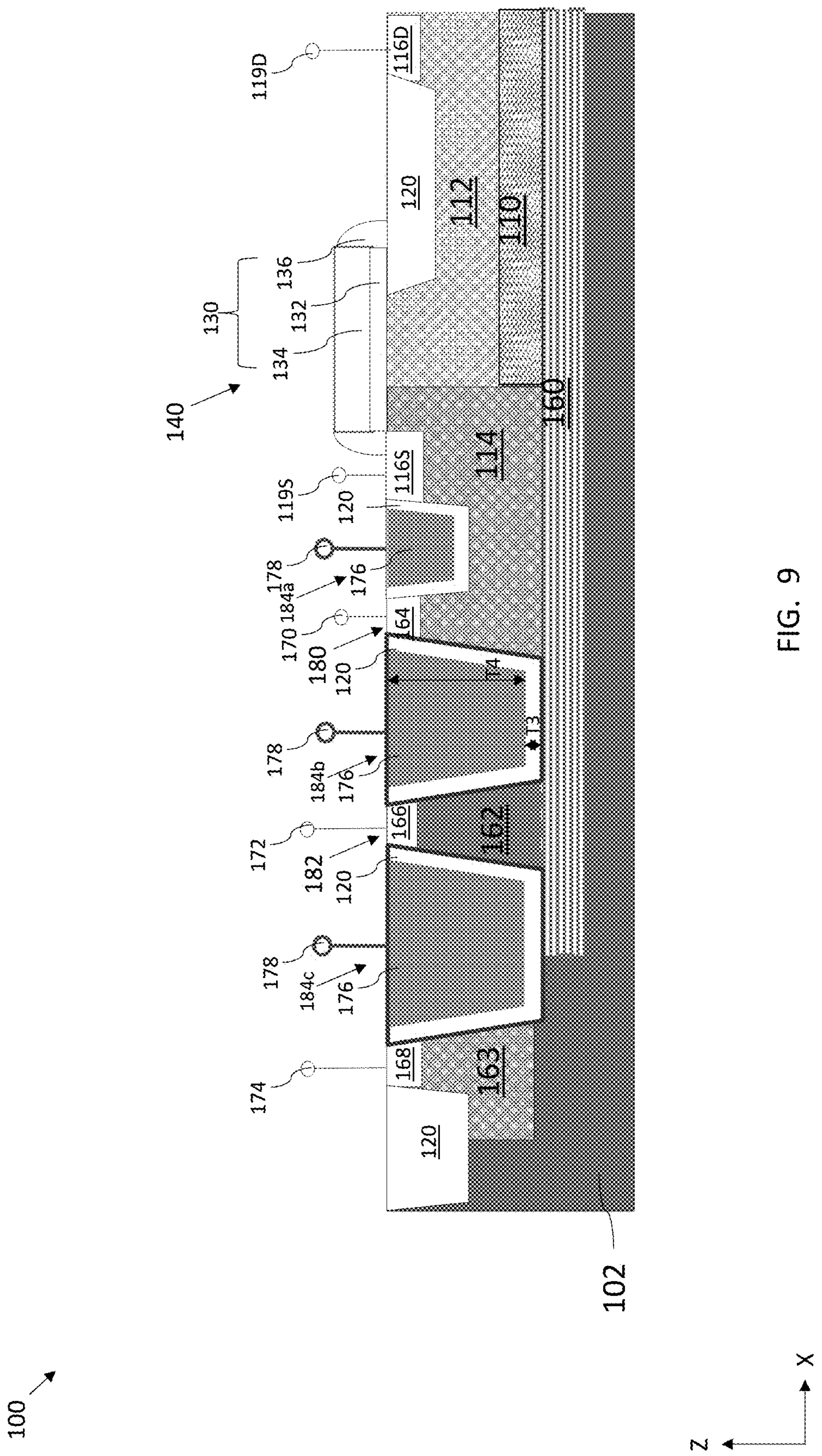

As described above, in some embodiments, the isolation regions 120 are STI regions. In some embodiments, the isolation regions 120 are DTI regions. As shown in FIG. 9, the isolation regions 120 disposed between the well region 114 and the well region 162 and between the well region 162 and the well region 163 extend to the deep well region 160. Thus, the isolation structures 184*b*, 184*c* each includes the conductive layer 176 disposed in the isolation region 120 (or DTI region). In some embodiments, the isolation structure 184*a* includes the conductive layer 176 disposed in the isolation region 120 (or STI region). In some embodiments, the isolation region 120 of the isolation structure 184*b* has a thickness T3 ranging from about 50 nm to about 150 nm, and the thickness of the conductive layer 176 of the isolation structure 184*b* has a thickness T4 ranging from about 2.5 microns to about 3.3 microns. In some embodiments, the thickness T3 is about 1.5 percent to about 50 percent of the thickness T4.

Figure 10:
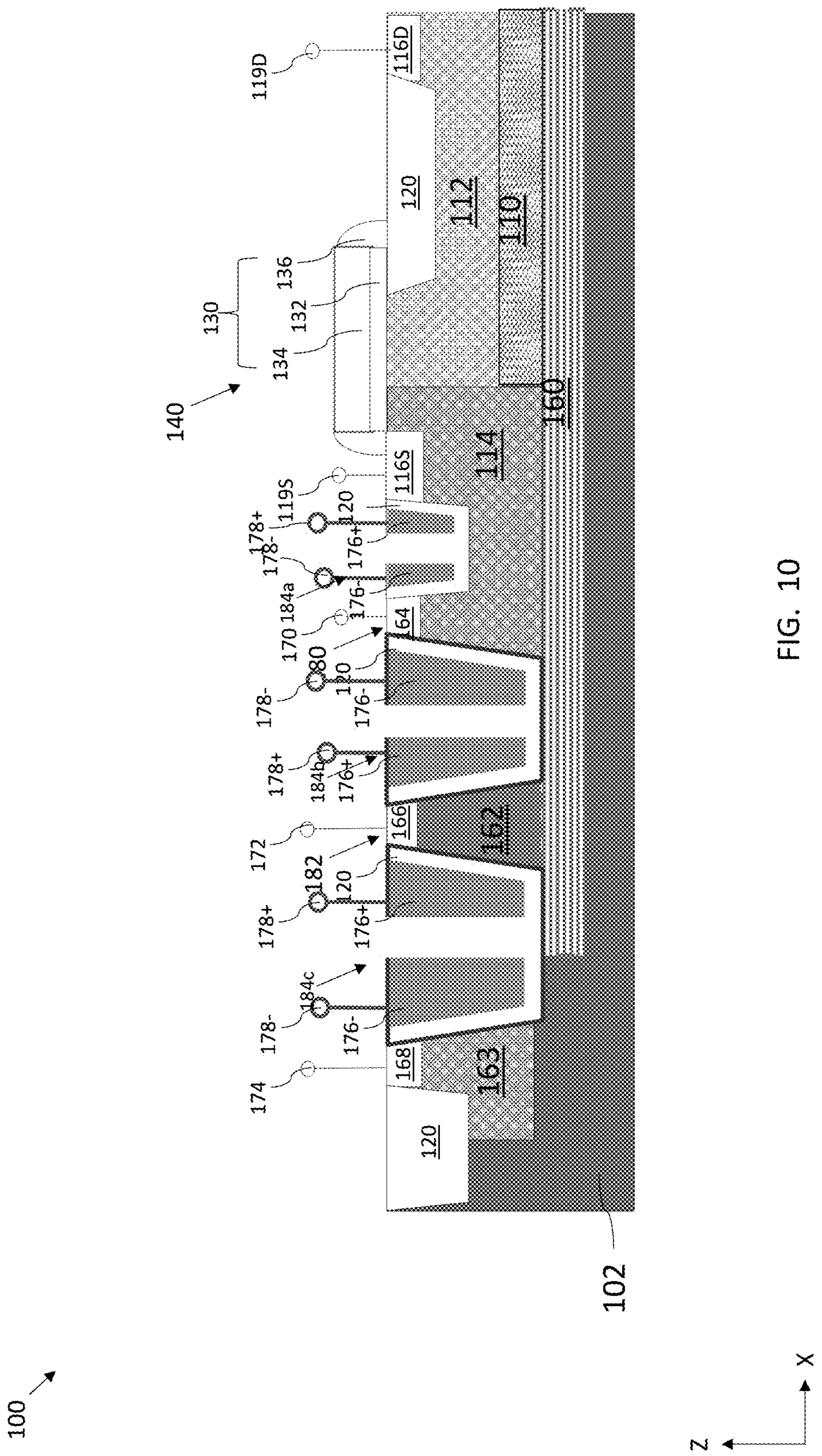

In some embodiments, each isolation structure includes two discrete conductive layers 176+, 176− disposed in a single isolation region 120, as shown in FIG. 10. For example, in an isolation region 120 disposed between a p-type well region, such as the well region 114, and an n-type well region, such as the well region 162, the conductive layer 176− is disposed adjacent to the p-type well region, while the conductive layer 176+ is disposed adjacent to the n-type well region, as shown in FIG. 10. Conductive contacts 178+, 178− are formed over corresponding conductive layers 176+, 176−.

Figure 11:
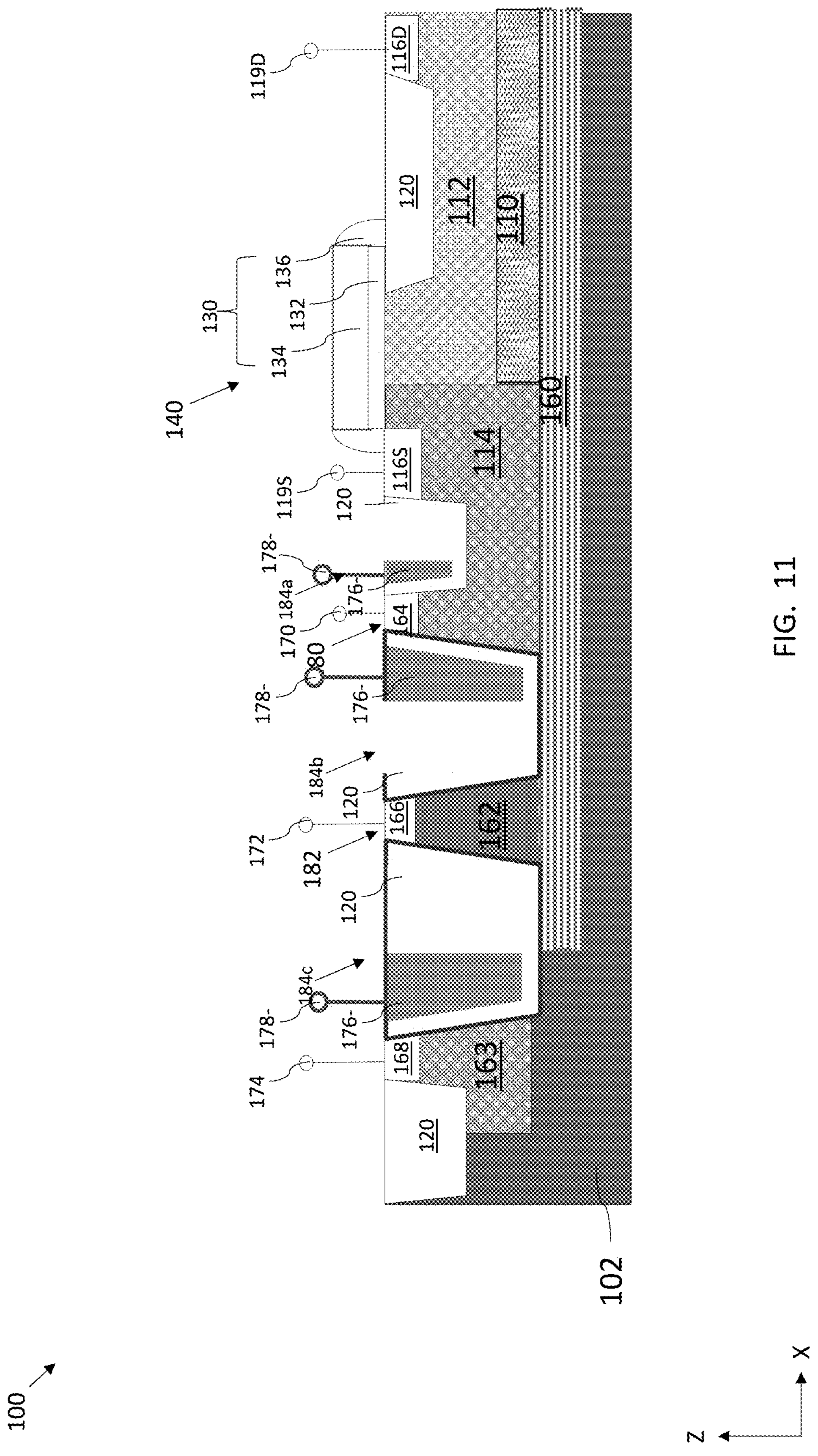
Figure 12:
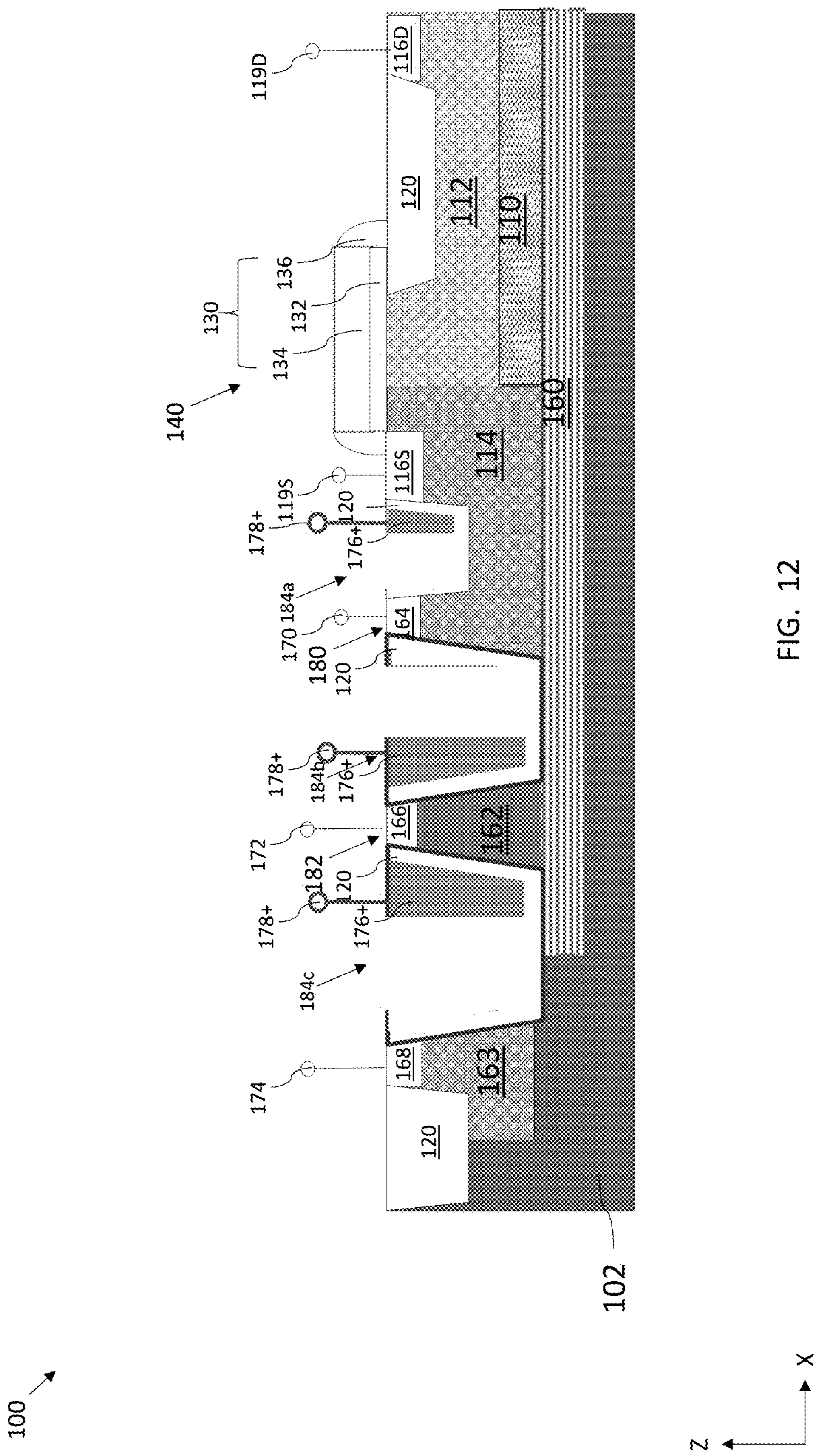

In some embodiments, the conductive layers 176+ are not present, and each isolation structure 184*a*, 184*b*, 184*c* includes the conductive layer 176− disposed in the isolation region 120 adjacent to a p-type well region, such as the well regions 114, 163, as shown in FIG. 11. The conductive contacts 178+ are also not present. In some embodiments, the conductive layers 176− are not present, and each isolation structure **184*a*, 184*b*, 184*c* includes the conductive layer 176+ disposed in the isolation region 120 adjacent to an n-type well or doped region, such as the well regions 162 and the source region 116S, as shown in FIG. 12. The conductive contacts 178− are also not present. In other words, the conductive layer 176+ or 176− may be formed asymmetrically in the isolation region 120** with respect to the x-z plane.

Figure 13:
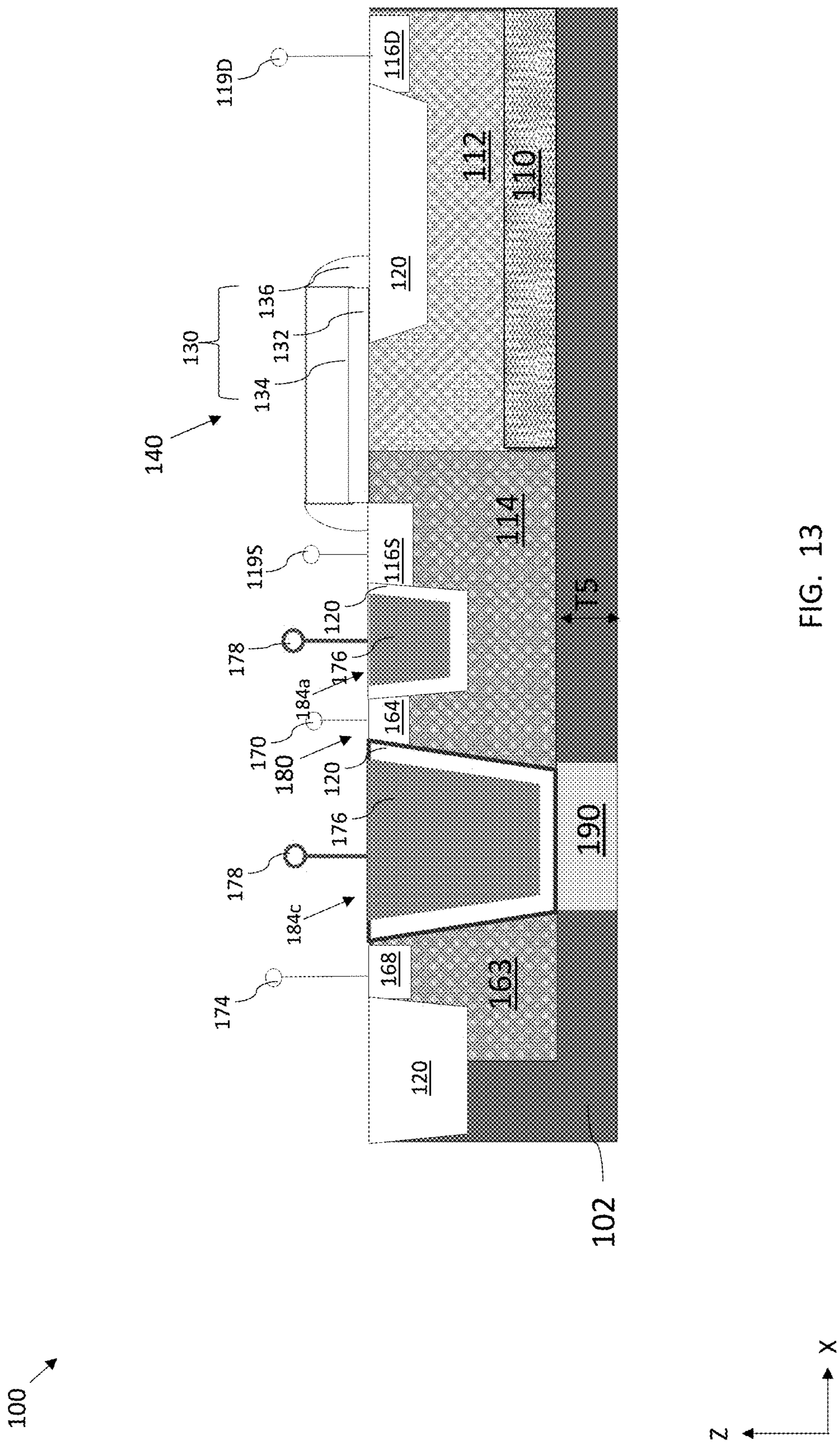

In some embodiments, the guard structure 182, the isolation structure **184*b*, and the well region 162 are not present, and the substrate 102 is thinned to a thickness T5 about a few microns, as shown in FIG. 13. The high-voltage device structure 100 shown in FIG. 13 may be part of a three-dimensional IC (3DIC) package. With the thinned substrate 102, the region 190 of the substrate 102 may become depleted or inversed, as a result of applying a negative voltage to the conductive layer 176 of the isolation structure 184C during operation. The depleted or inversed region 190 helps to electrically isolate the device 140** from the neighboring devices of the 3DIC package.

Figure 14:
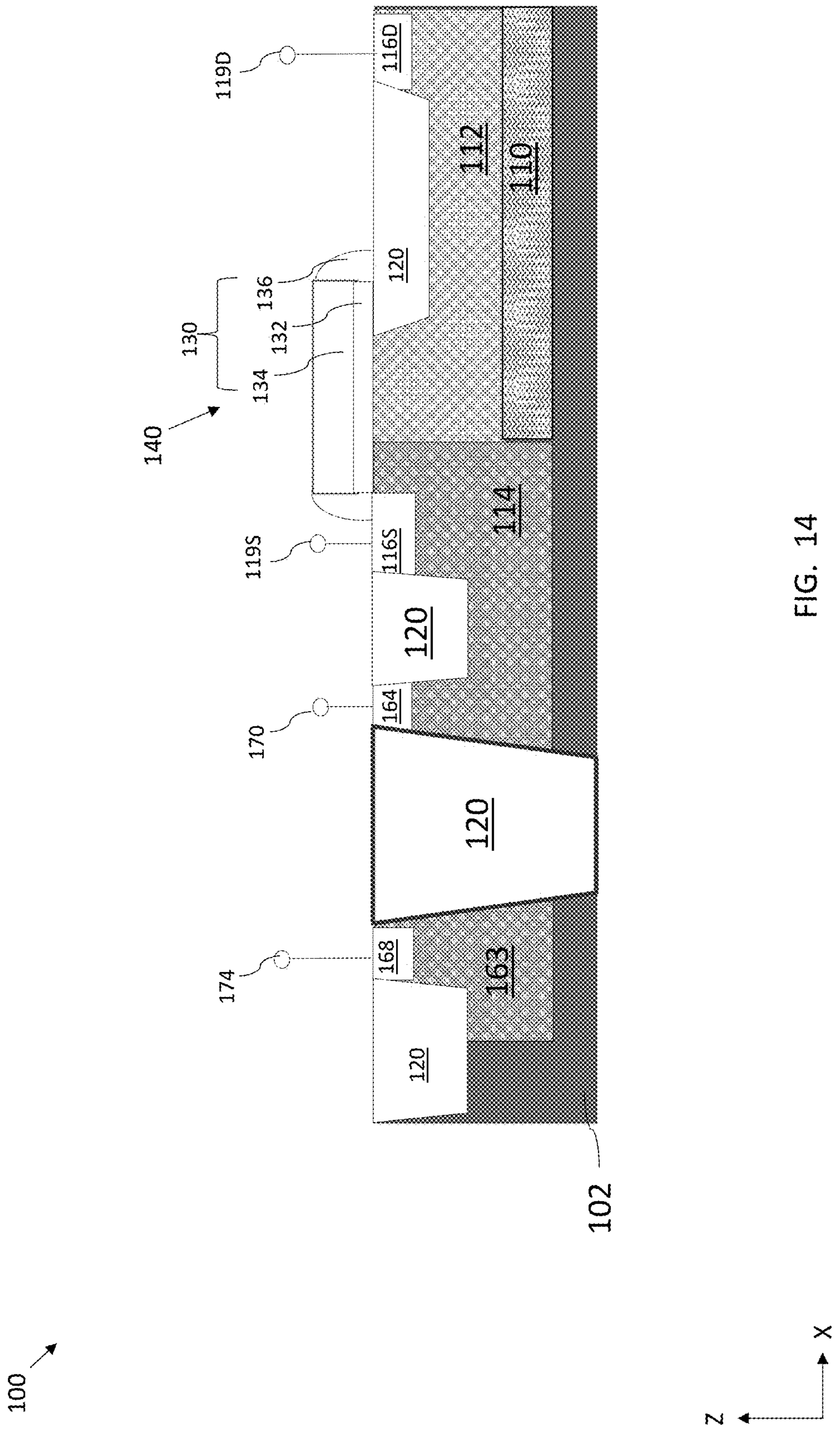

In some embodiments, the conductive layers 176 are not present in the isolation regions 120, as shown in FIG. 14, and the substrate 102 is thinned to a few microns to expose a bottom of the isolation region 120, which is in contact with other devices of the 3DIC package. The exposed isolation region 120, which may be a DTI region or a STI region, can help to electrically isolate the device 140 from neighboring devices of the 3DIC package.

Figure 15A:
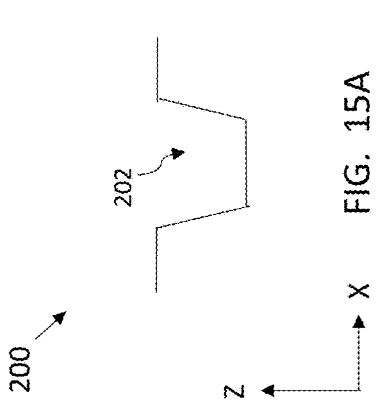
FIGS. 15A-15H Illustrate cross-sectional side views of an isolation structure in various stages of manufacturing, in accordance with some embodiments.
Figure 15B:
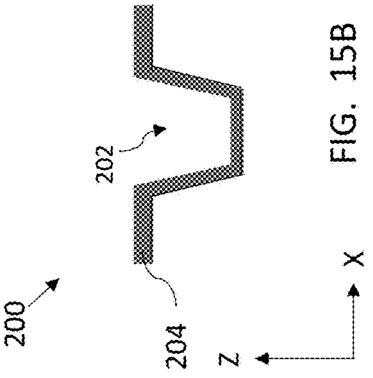
Figure 15C:
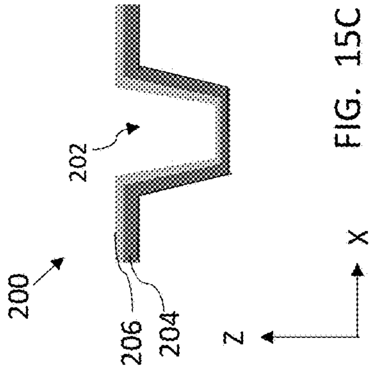

FIGS. 15A-15H Illustrate cross-sectional side views of an isolation structure 200 in various stages of manufacturing, in accordance with some embodiments. The isolation structure 200 may be the isolation structure **184*a*, 184*b*, 184*c* shown in FIG. 6 of FIG. 10. As shown in FIG. 15A, an opening 202 is formed in a substrate, such as the substrate 102. Next, an oxide layer 204 is formed in the opening 202, as shown in FIG. 15B. The oxide layer 204 may be formed by any suitable process. In some embodiments, the oxide layer 204 is formed by oxidation process that oxidizes the exposed surfaces of the substrate 102. The oxide layer 204 may be a liner having a thickness ranging from about 20 nm to about 40 nm. As shown in FIG. 15C, a dielectric layer 206 is formed on the oxide layer 204. The dielectric layer 206 may be formed by any suitable process. In some embodiments, the dielectric layer 206 is formed by ALD. The dielectric layer 206 may include any suitable dielectric material. In some embodiments, the dielectric layer 206 includes silicon nitride. The dielectric layer 206 has a thickness ranging from about 25 nm to about 35 nm, and the dielectric layer 206 may function as a CMP stop layer during subsequent conductor CMP process. In some embodiments, the k value of the dielectric layer 206 is substantially higher than that of the oxide layer 204**.

Figure 15D:
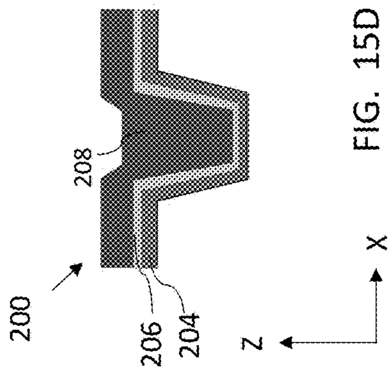
Figure 15E:
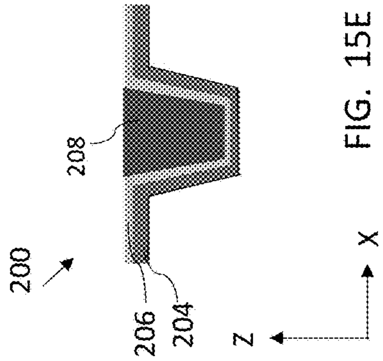

As shown in FIG. 15D, a conductive material 208 is formed on the dielectric layer 206 to fill the opening 202. The conductive material 208 may include the same material as the conductive layer 176. The conductive material 208 may be formed by any suitable process, such as PVD or ECP. Next, as shown in FIG. 15E, a planarization process, such as a CMP process, is performed to remove the portion of the conductive material 208 formed on the dielectric layer 206 outside of the opening 202. As described above, the dielectric layer 206 may function as a CMP stop layer for the planarization process.

Figure 15F:
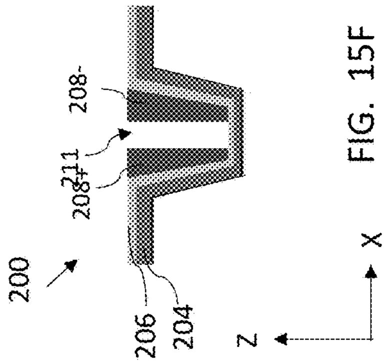
Figure 15H:
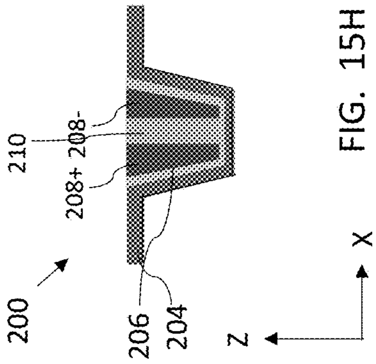
Figure 15G:
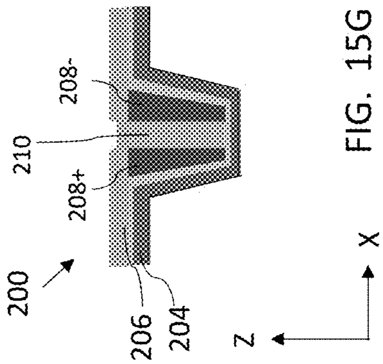

As shown in FIG. 15F, the conductive material 208 is patterned. In some embodiments, a center portion of the conductive material 208 is removed, forming two conductive layers 208+, 208−, which may be the conductive layers 176+, 176−. In some embodiments, a side portion of the conductive material 208 is removed, forming one of the conductive layers 208+, 208−. The patterning of the conductive material 208 forms an opening 211 separating the conductive layers 208+, 208−. Next, as shown in FIG. 15G, a dielectric material 210 is formed in the opening 211 and over the substrate. The dielectric material 210 may include any suitable dielectric material. In some embodiments, the dielectric material 210 includes the same material as the isolation region 120. In some embodiments, the dielectric material 210 includes an oxide and is formed by ALD. By using ALD, gap-filling property of the dielectric material 210 is improved. Next, as shown in FIG. 15H, a planarization process is performed to remove the portion of the dielectric material 210 formed outside of the opening 211. The planarization process may be a CMP process. In some embodiments, the portion of the dielectric layer 206 formed outside of the opening 202 may be also removed by the planarization process.

The present disclosure provides a high-voltage device structure 100 and methods of forming the same. In some embodiments, the high-voltage device structure 100 includes a guard structure 150 having a pickup region 118B butted against the source region 116S. In some embodiments, the high-voltage device structure 100 includes one or more isolation structures **184*a-c*. Some embodiments may achieve advantages. For example, the guard structure 150 with the pickup region 118B butted against the source region 116S leads to smaller guard structure, which in turn saves layout area. The isolation structure 184*a-c* includes one or more conductive layers 176 formed in the isolation regions 120 to improve pickup efficiency and electrical isolation of the device 140**.

An embodiment is a high-voltage device structure. The structure includes a deep well region of a first conductivity type disposed in a substrate, a doped region disposed on the deep well region; a well region of the first conductivity type surrounding the deep well region and the doped region; a source region disposed on the well region, a drain region disposed on the doped region, and a first pickup region of the first conductivity type disposed on the well region. The first pickup region is laterally in contact with the source region, and the first pickup region, the well region, and the deep well region are electrically connected.

Another embodiment is a high-voltage device structure. The structure includes a high-voltage device disposed over a substrate, and the high-voltage device includes a source region, a drain region, and a gate structure. The structure further includes a first guard structure surrounding the source region and the drain region of the high-voltage device, and the first guard structure includes a first pickup region, a first well region, and a first deep well region. The structure further includes a first isolation structure disposed between the source region of the high-voltage device and the first pickup region of the first guard structure, and the first isolation structure includes a first conductive layer disposed in a first isolation region.

A further embodiment is a method. The method includes forming a first opening in a substrate, forming an oxide layer in the first opening, depositing a dielectric layer on the oxide layer in the first opening, depositing a conductive material on the dielectric layer to fill the first opening, patterning the conductive material to form a second opening separating two conductive layers, and depositing a dielectric material in the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a first opening in a substrate;

forming an oxide layer in the first opening;

depositing a dielectric layer on the oxide layer in the first opening;

depositing a conductive material on the dielectric layer to fill the first opening;

patterning the conductive material to form a second opening separating the conductive material into two conductive layers; and depositing a dielectric material in the second opening, wherein the oxide layer, the dielectric layer, the two conductive layers, and the dielectric material form an isolation structure.

2. The method of claim 1, wherein the substrate comprises a first well region of a first conductivity type and a second well region of a second conductivity type opposite the first conductivity type, and the first opening is formed in the first and second well regions.

3. The method of claim 1, wherein the patterning the conductive material comprises removing a center portion of the conductive material.

4. The method of claim 1, wherein the dielectric material is formed by atomic layer deposition.

5. A method, comprising:

forming a first opening in a substrate;

forming an oxide layer in the first opening;

depositing a dielectric layer on the oxide layer in the first opening;

depositing a conductive material on the dielectric layer to fill the first opening;

removing a side portion of the conductive material to form a second opening, wherein the dielectric layer and a remaining portion of the conductive material are exposed in the second opening; and depositing a dielectric material in the second opening, wherein the oxide layer, the dielectric layer, the remaining portion of the conductive material, and the dielectric material form an isolation structure.

6. The method of claim 5, wherein the oxide layer is formed by an oxidation process.

7. The method of claim 6, wherein the oxide layer is formed on the substrate.

8. The method of claim 7, wherein the dielectric layer is deposited by an atomic layer deposition process.

9. The method of claim 8, wherein the dielectric layer is deposited over the substrate.

10. The method of claim 9, further comprising performing a first planarization process after depositing the conductive material, wherein a top surface of the dielectric layer and a top surface of the conductive material are coplanar.

11. The method of claim 10, further comprising performing a second planarization process after depositing the dielectric material, wherein a top surface of the oxide layer and a top surface of the dielectric material are coplanar.

12. A method, comprising:

forming a guard structure on opposite sides of a high-voltage metal-oxide-semiconductor (HVMOS) transistor, comprising:

forming a deep well region in a substrate, wherein the deep well region is a first conductivity type;

forming a first well region on a first side of the deep well region, wherein a bottom of the first well region and a bottom of the deep well region are at a same level;

forming a first pick up region on the first well region;

forming a second well region on a second side of the deep well region opposite the first side; and forming a second pick up region on the second well region; and forming a doped region on the deep well region, wherein the doped region is a second conductivity type opposite the first conductivity type.

13. The method of claim 12, wherein the first conductivity type is p-type, and the second conductivity type is n-type.

14. The method of claim 13, wherein the first and second well regions interface the doped region.

15. The method of claim 14, wherein the first and second well regions are p-type well regions.

16. The method of claim 12, further comprising forming a source region on the first well region, wherein the source region and the first pick up region are butted against each other.

17. The method of claim 16, wherein the source region and the first pick up region have opposite conductivity types.

18. The method of claim 12, further comprising forming an isolation structure adjacent the first pick up region.

19. The method of claim 18, wherein the forming of the isolation structure comprises:

forming a first opening;

depositing a dielectric layer in the first opening;

depositing a conductive material on the dielectric layer to fill the first opening;

removing a portion of the conductive material to form a second opening; and depositing a dielectric material in the second opening.

20. The method of claim 19, wherein the conductive material is configured to receive a positive voltage to create electric fields around the guard structure.

* * * * *